United States Patent
Neidich et al.

[11] Patent Number: 5,899,757
[45] Date of Patent: May 4, 1999

[54] COMPRESSION CONNECTOR

[75] Inventors: Douglas A. Neidich, Lower Paxton Township, Dauphin County; Grant R. Adams, Jr., East Pennsboro Township, Cumberland County, both of Pa.

[73] Assignee: InterCon Systems, Inc., Middletown, Pa.

[21] Appl. No.: 08/963,401

[22] Filed: Nov. 3, 1997

[51] Int. Cl.⁶ ................................................. H01R 9/09
[52] U.S. Cl. ............................................................ 439/67
[58] Field of Search ........................................ 439/67, 74

[56] References Cited

U.S. PATENT DOCUMENTS

| | | | |
|---|---|---|---|
| 3,880,486 | 4/1975 | Avakian | 439/86 |
| 3,924,915 | 12/1975 | Conrad | 439/66 |
| 4,442,938 | 4/1984 | Murphy | 206/728 |
| 4,451,714 | 5/1984 | Eventoff | 200/5 A |
| 4,466,184 | 8/1984 | Cuneo et al. | 29/830 |
| 4,602,317 | 7/1986 | Rovnyak et al. | 361/785 |
| 4,695,258 | 9/1987 | Hanson et al. | 439/67 |
| 4,707,657 | 11/1987 | Bøegh-Petersen | 324/537 |
| 4,902,234 | 2/1990 | Brodsky et al. | 439/67 |
| 4,975,068 | 12/1990 | Squires | 439/67 |
| 4,976,626 | 12/1990 | Dibble et al. | 439/67 |
| 5,049,084 | 9/1991 | Bakke | 439/66 |
| 5,059,129 | 10/1991 | Brodsky et al. | 439/67 |
| 5,105,537 | 4/1992 | Datta et al. | 29/884 |
| 5,118,299 | 6/1992 | Burns et al. | 439/74 |
| 5,163,834 | 11/1992 | Chapin et al. | 439/66 |
| 5,171,154 | 12/1992 | Casciotti et al. | 439/67 |
| 5,190,463 | 3/1993 | Datta et al. | 439/74 |
| 5,215,471 | 6/1993 | Reymond et al. | 439/66 |
| 5,248,261 | 9/1993 | Conroy-Wass et al. | 439/65 |
| 5,248,262 | 9/1993 | Busacco et al. | 439/66 |
| 5,354,205 | 10/1994 | Feigenbaum et al. | 439/67 |
| 5,461,482 | 10/1995 | Wilson et al. | 347/50 |
| 5,501,610 | 3/1996 | Ikemoto | 439/498 |
| 5,514,008 | 5/1996 | Kocher et al. | 439/495 |
| 5,533,904 | 7/1996 | Nobel et al. | 439/67 |
| 5,575,662 | 11/1996 | Yamamoto et al. | 439/67 |

OTHER PUBLICATIONS

"A High Density Pad–on–Pad Connector Utilizing a Flexible Circuit", R.S. Pokrzywa et al., Copyright 1993 IEEE, pp. 461–464.

"A High Density Edge Connector", J. Campbell et al., Copyright 1995, IEEE, pp. 140–143.

*Primary Examiner*—Neil Abrams
*Assistant Examiner*—T C Patel
*Attorney, Agent, or Firm*—Webb Ziesenheim Logsdon Orkin & Hanson, P.C.

[57] ABSTRACT

A connector utilized to electrically connect together conductive pads disposed on different substrates includes a flexible substrate having a plurality of conductive through-holes therein. A conductive line formed in the flexible substrate extends between at least two of the conductive through-holes. A plurality of contacts are mounted in the conductive through-holes of the flexible substrate. Each contact includes a post connected to a base of a crown-shaped head having a plurality of projections around the periphery of the base that extend away from the base in the direction opposite the post. The post of each contact is soldered into one of the plurality of conductive through-holes. A compression mat positioned on a side of the flexible substrate opposite the crown-shaped heads includes a plurality of resilient cylinders that extend away from a resilient base. Each resilient cylinder has a distal end alignable in registration with a distal end of the post of one of the plurality of contacts. A compression fitting is positionable adjacent the resilient base of the compression mat. The compression fitting co-acts with one of the substrates to apply a clamping force therebetween that urges a projection of each contact into electrical contact with one of the conductive pads.

17 Claims, 8 Drawing Sheets

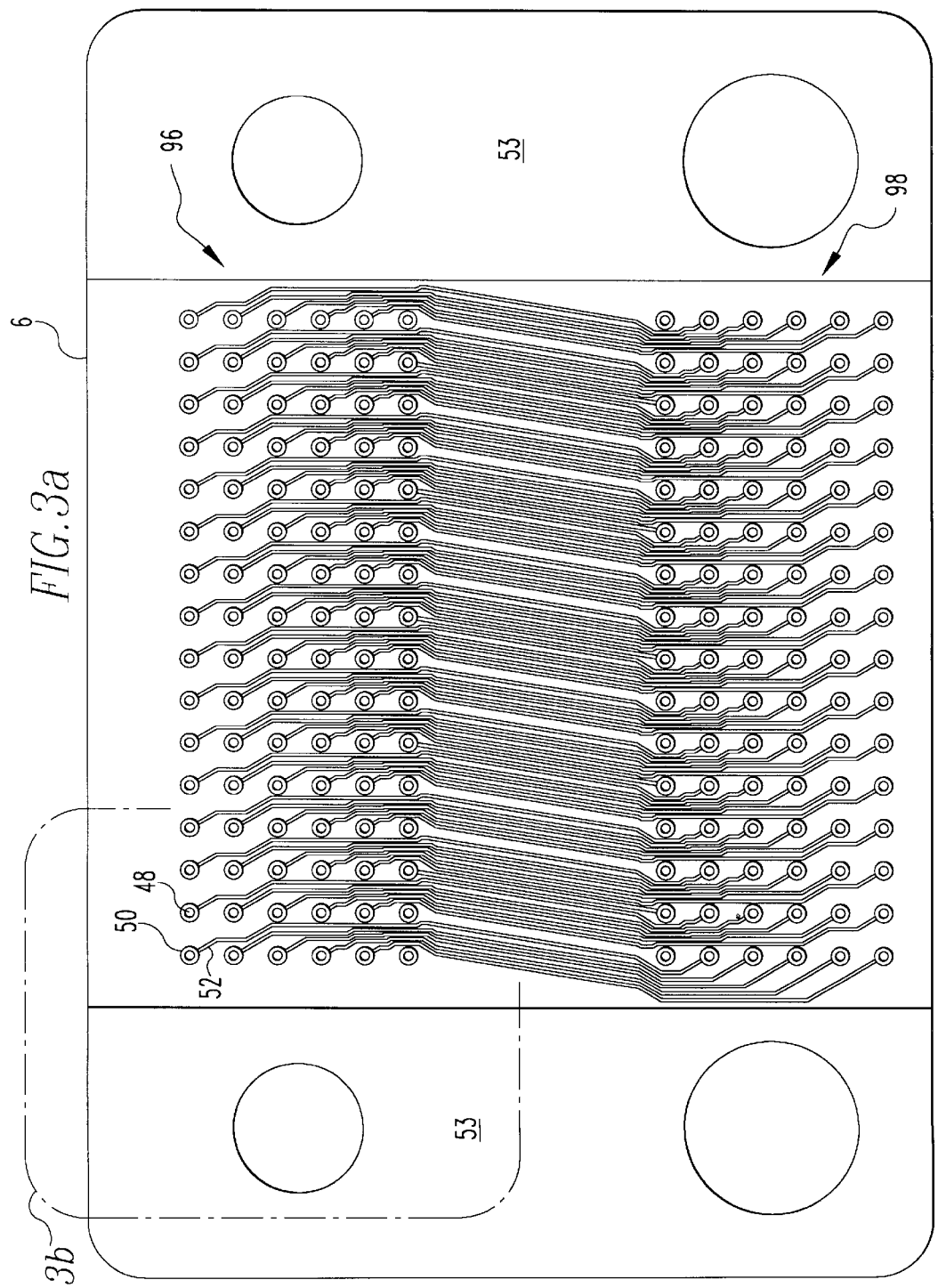

COMPRESSION CONNECTOR

BACKGROUND OF THE INVENTION

1. Field of the Invention

This invention relates to electrical connectors and, more particularly, to high density electrical connectors utilized to electrically connect electronic devices disposed on two or more printed circuit boards.

2. Description of the Prior Art

Increased integration of electronic devices has created an interconnection problem for printed circuit boards receiving these devices. Specifically, the number of interconnections required to electrically connect together two or more printed circuit boards receiving these electronic devices has exceeded the connection densities of prior art pin-in-socket connectors. Moreover, these prior art pin-in-socket connectors typically have relatively long and unshielded lengths which have uncontrolled impedances resulting in less than desired electrical performance.

A high contact density connector utilizable for electrically connecting together electronic devices received on two or more printed circuit boards and overcoming the foregoing problems is disclosed in an article entitled "A High Density Edge Connector" by J. Campbell et al., Copyright 1995 IEEE. This article discloses a flex circuit formed of a 2 mil thick polyimide film having 3 mil wide copper lines plated onto one side thereof and 25 mil round contact pads plated on the side of the film opposite the circuit lines and along both edges of the film 4 mil diameter plated through-holes, or vias, extend between the contact pads on one side of the film and the circuit lines on the other side. Palladium dendrites, or spires, are electro-deposited on surfaces of each contact pad. These dendrites straddle dust or fibers and puncture oils or films present on each contact pad prior to connector mating and produce on each contact pad a multitude of conductive connections. The connector includes a molded plastic force block to which elastomeric cylinders are molded These cylinders act as springs which provide force, when compressed during assembly, to make and maintain an electrical connection between the contact pads on the film and the pads on a printed circuit board. One cylinder is provided for each contact and compensates for any variation in planarity and tolerance accumulation. Conical alignment pins are utilized to mate alignment holes in the flex circuit with alignment holes in the printed circuit board during assembly, thereby ensuring proper registration between the contact pads on the film and the pads on the printed circuit board.

Another flexible circuit connector for connecting a daughter card and a mother board is disclosed in an article entitled "A High Density Pad-On-Pad Connector Utilizing A Flexible Circuit" by R. S. Pokrzywa, Copyright 1993 IEEE. This connector utilizes a two-sided flex circuit having plated, spherical contacts contacting flat printed circuit pads on the daughter card and on the mother board. The spherical contacts on the flex circuit are 5 mils in diameter and have a copper base metal overplated with nickel and gold. Alignment pins are utilized to align the flex circuit, the daughter card and the mother board so that each spherical contact mates with a desired printed circuit pad. Precipitation hardened stainless steel curved beams provide contact force for reliable connection between the spherical contacts and the printed circuit pads. During actuation, the curved beam is flattened to produce a uniform load across the contact area. An elastomeric pad is positioned between the beam and the contact area to accommodate local discrepancies in load across the contact area and to focus the connector forces. In one embodiment, the elastomeric pad has a plurality of elastomeric cylinders utilized to back-up the spherical contacts. In another embodiment, where size does not permit molding individual cylinders for each spherical contact, an elastomeric rib is utilized to back a row of spherical contacts.

A problem with spherical contact pads and electro-deposited dendrites on contact pads is that they inconsistently break through contaminants, such as oxides, films or foreign materials, that may be present thereon or on the contact pad of a printed circuit board. Hence, inadequate electrical contact or, in some instances, no electrical contact is made between the contact pad of the flexible circuit and the contact pad of the printed circuit board. Moreover, the formation of dendrites on the contacts of the flexible circuit increases the cost of such connectors.

It is therefore an object the present invention to provide a connector which overcomes these drawbacks of the prior art connectors. It is an object of the present invention to provide a compression connector contact that promotes electrical contact with a conductive pad of a printed circuit board. It is an object of the present invention to provide a method for making a connector that utilizes the provided compression connector contact. It is an object of the present invention to provide a method of making a flexible circuit connector that is less costly to manufacture than the prior art flex circuit connectors.

SUMMARY OF THE INVENTION

Accordingly, we have invented a compression connector utilized to electrically connect together conductive pads disposed on one or more substrates. The compression connector includes a flexible substrate having a plurality of conductive through-holes therein and at least one conductive line thereon extending between at least two of the conductive through-holes. The compression connector also includes a plurality of contacts. Each contact has a post connected to a base of a crown-shaped head having a plurality of projections around the periphery of the base that extend away from the base in a direction opposite the post. The post of each contact is secured in one of the plurality of conductive through-holes.

A compression mat can be positioned on the side of the flexible substrate opposite the crown-shaped heads of the plurality of contacts. The compression mat can include a plurality of resilient cylinders extending away from a resilient base. Each resilient cylinder can have a distal end alignable in registration with a distal end of the post of one of the plurality of contacts secured in one of the plurality of conductive through-holes.

A transfer film can be utilized to transfer the plurality of contacts to the flexible substrate prior to securing each post in one of the plurality of conductive through-holes. The transfer film preferably has a plurality of elastically deformable receiving apertures which receive and secure the crown-shaped heads of the plurality of contacts.

The compression connector can also include a rigid substrate, such as a printed circuit board, which has a plurality of the conductive pads on a surface thereof and at least one conductive line connected to at least one of the conductive pads. The rigid substrate and the flexible substrate are alignable so that at least one projection of each contact on the flexible substrate is aligned in registration with one of the conductive pads on the surface of the rigid substrate.

A compression fitting can be positionable adjacent the resilient base of the compression mat. The compression fitting forces together at least one projection of each contact and the conductive pad in registration therewith. Each resilient column of the compression mat contacts the distal end of a post of a contact and functions as the spring when compressed to make and maintain good electrical connection between the projection and the conductive pad.

Preferably, a plurality of alignment holes in each of the flexible substrate, the rigid substrate and the compression fitting co-act with a like plurality of alignment pins to align the flexible substrate, the rigid substrate and the compression fitting so that the heads of the plurality of contacts are in registration with the plurality of contact pads. Each alignment pin is preferably a bolt having a threaded end adapted to mate with a threaded nut.

We have invented a compression connector contact that includes a crown-shaped head having a base and a plurality of projections disposed around the periphery of the base and extending to one side thereof. A post extends from the side of the base opposite the projections.

The side of the base opposite the post can have a cavity formed therein in registration with a lengthwise axis of the post. The base can have a periphery having a generally rectangular outline. Each corner of the generally rectangular outline of the base can be rounded and can include one of the plurality of projections. Each projection can have a rounded edge formed continuous with the periphery of the base.

We have also invented a method of making a connector that includes providing a plurality of contacts, each contact having a post connected to a base of a crown-shaped head. Each crown-shaped head has a plurality of projections around the periphery of the base that extends away from the base in a direction opposite the post. The crown-shaped heads of the plurality of contacts are inserted into a plurality of receiving apertures in a transfer film so that the posts extend out of the plurality of receiving apertures. A flexible substrate is provided having a plurality of conductive through-holes therein and a plurality of conductive lines thereon. At least one conductive line extends between and electrically connects at least two of the conductive through-holes. The transfer film and the flexible substrate are mated so that the posts of the plurality of contacts are received in the plurality of conductive through-holes in the flexible substrate. The posts of the plurality of contacts are fused to the plurality of conductive through-holes in the flexible substrate. The transfer film is then separated from the flexible substrate and the plurality of contacts.

The plurality of contacts are formed from a strip of conductive material. Each contact is connected to an adjacent contact by a rib formed from the conductive strip. Each contact is excised from its connecting rib and inserted into one of the receiving apertures in the transfer film. Each receiving aperture elastically deforms to receive and retain the head of the contact therein.

BRIEF DESCRIPTION OF THE DRAWINGS

FIG. 2b is a side view of the compression mat of FIG. 2a;

FIG. 7 is a cross section of the contacts of the conductive strip of FIG. 4a received in receiving apertures of the transfer film of FIG. 6 and positioned in alignment with through-holes formed in the flexible substrate of FIG. 3a;

DESCRIPTION OF THE PREFERRED EMBODIMENT

Figure 1A:
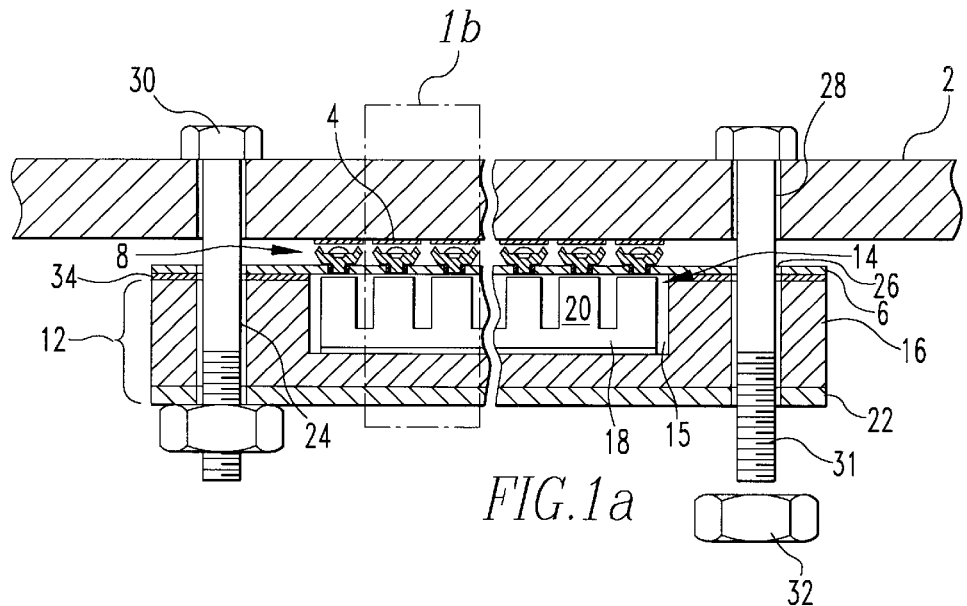
FIG. 1a is a cross section of a compression connector in accordance with the present invention.
Figure 1B:
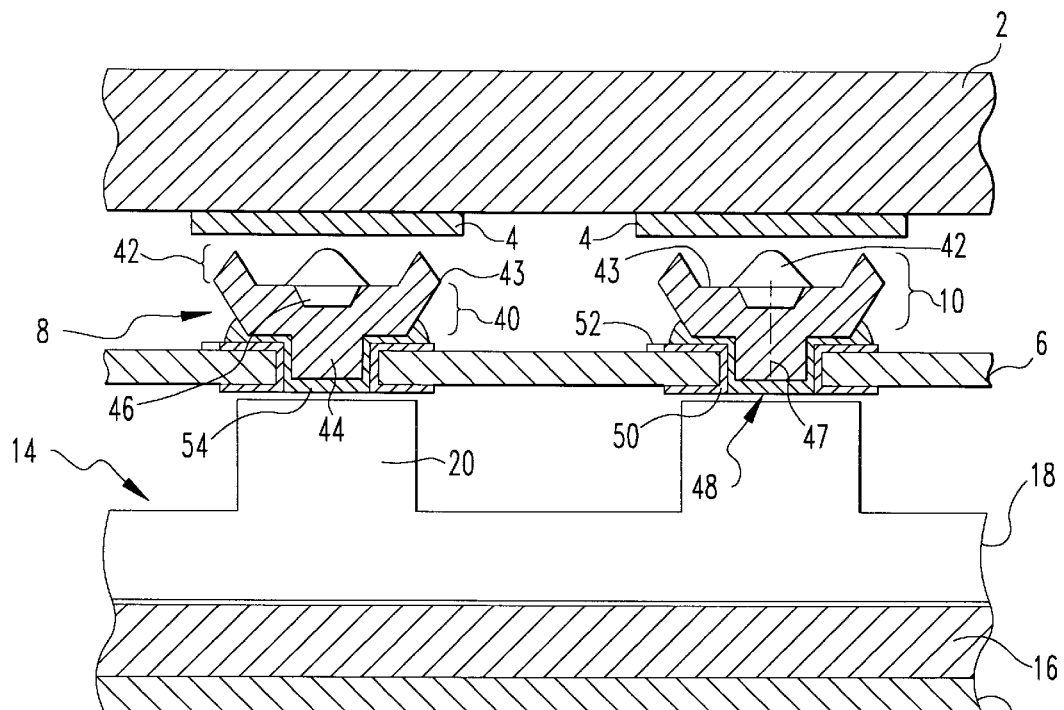
FIG. 1b is an enlarged view of a portion of FIG. 1a within line 1b.

Referring to FIGS. 1a–1b, a rigid substrate 2, such as a printed circuit board formed of FR-4 or ceramic, has a plurality of conductive pads 4 formed thereon in a manner known in the art. The rigid substrate 2 may include one or more conductive lines that extend between one or more of the conductive pads 4 or between a conductive pad 4 and an electronic device connected to the rigid substrate 2. The conductive lines and electronic device are not shown on the rigid substrate 2 in FIGS. 1a–1b for simplicity of illustration.

A flexible insulating substrate 6 having a plurality of contacts 8 secured thereon is positioned adjacent the rigid substrate 2. The flexible substrate 6 is preferably formed of a polyimide film such as Kapton®. Kapton® is a registered trademark of E.I. DuPont DeNemours & Company. The contacts 8 are secured on the flexible substrate 6 in a pattern matching the pattern of the conductive pads 4 on the rigid substrate 2. Each contact 8 includes a head 10 that extends away from a surface of the flexible substrate 6. Aligning the flexible substrate 6 and the rigid substrate 2 positions the heads 10 in registration with the conductive pads 4.

Figure 2A:
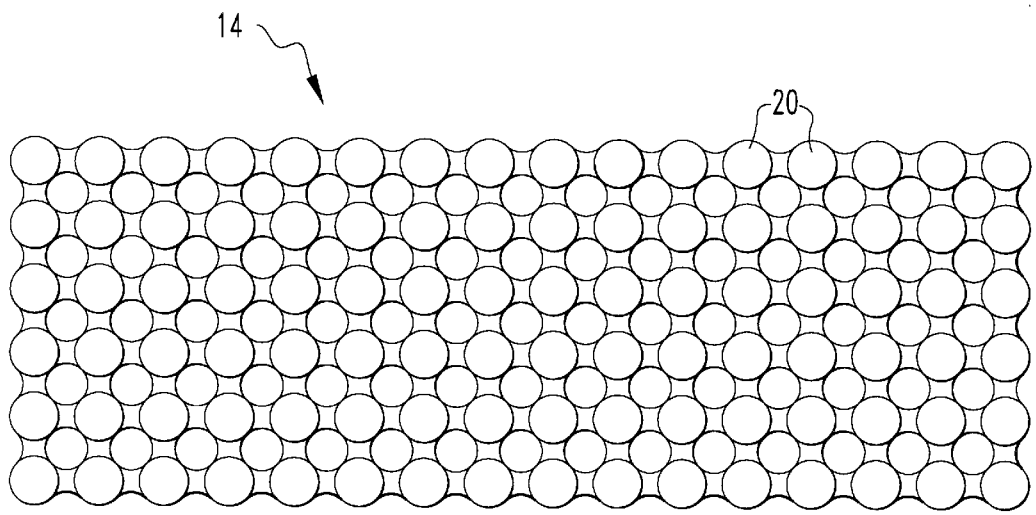
FIG. 2a is a plan view of a compression mat of the compression connector in FIG. 1.
Figure 2B:
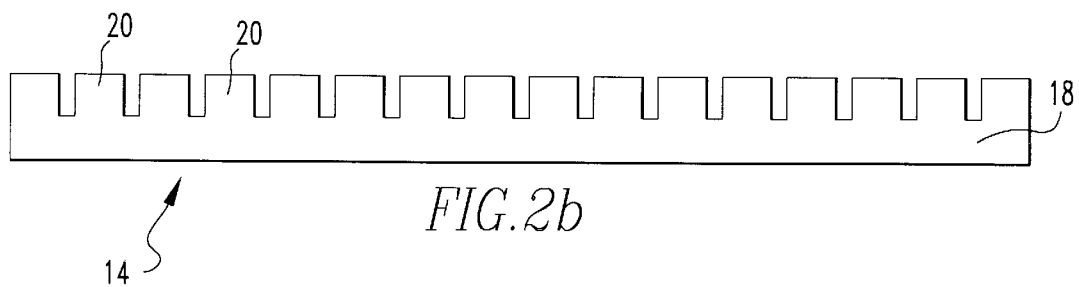

A compression fitting 12 is positioned on the side of the flexible substrate 6 opposite the heads 10 of the contacts 8. The compression fitting 12 includes a compression mat 14 received in an aperture 15 of an alignment sleeve 16. As shown in FIGS. 2a–2b, the compression mat 14 includes a resilient base 18, preferably having a generally rectangular outline, and a plurality of resilient cylinders 20 extending from the resilient base 18. The compression mat 14 and the flexible substrate 6 are positioned so that distal ends of the resilient cylinders 20 are aligned in registration with the contacts 8 on a surface of the flexible substrate 6 opposite the heads 10. The compression fitting 12 includes a washer 22 positioned on a side of the alignment sleeve 16 opposite the resilient base 18 of the compression mat 14. Preferably, the compression mat 14 is formed of a thermal silicon rubber, the alignment sleeve 16 is formed from a polyphenylene sulfide, UL 94 V-0, and the washer 22 is formed from stainless steel.

The compression fitting 12, the flexible substrate 6 and the rigid substrate 2 each have a plurality of alignment apertures 24, 26 and 28, respectively. Each alignment aperture 24, 26 and 28 is adapted to receive a shaft of an alignment pin 30, such as a bolt having an externally threaded end 31 adapted to mate with internal threads of a nut 32. Applying the nuts 32 to the alignment pins 30 urges together the compression fitting 12 and the rigid substrate 2. This urging together forces into contact the conductive pads 4 and the heads 10 in registration therewith, and the distal ends of the resilient cylinders 20 in registration with contacts 8 on the surface of the flexible substrate 6 opposite the heads 10. Continued application of the nuts 32 to the alignment pins 30 compresses the compression mat 14 between the flexible substrate 6 and the washer 22. This compression causes the resilient cylinders 20 to deform against the contacts 8 on the side of the flexible substrate 6 opposite the heads 10. This deformation causes each resilient cylinder 20 to apply a spring force between the head 10 and the conductive pad 4 in registration therewith. This spring force promotes between the head 10 and the conductive pad 4 in registration therewith the formation and maintenance of good electrical contact and compensates for any variations in planarity and tolerance accumulation. Preferably, double-sided tape 34 is utilized to adhere together adjacent surface of flexible substrate 6 and the sides of the alignment sleeve 16.

The head 10 of each contact 8 has a base 40 and a plurality of projections 42 disposed around a periphery 43 of the base 40. The projections 42 extend to one side of the base 40 and give the head 10 a crown-shaped appearance. Each contact 8 also has a post 44 that extends from a central part of the base 40 opposite the projections 42. A cavity 46 is preferably formed in each base 40 opposite the post 44 and in alignment with a lengthwise axis 47 of the post 44.

Figure 3B:
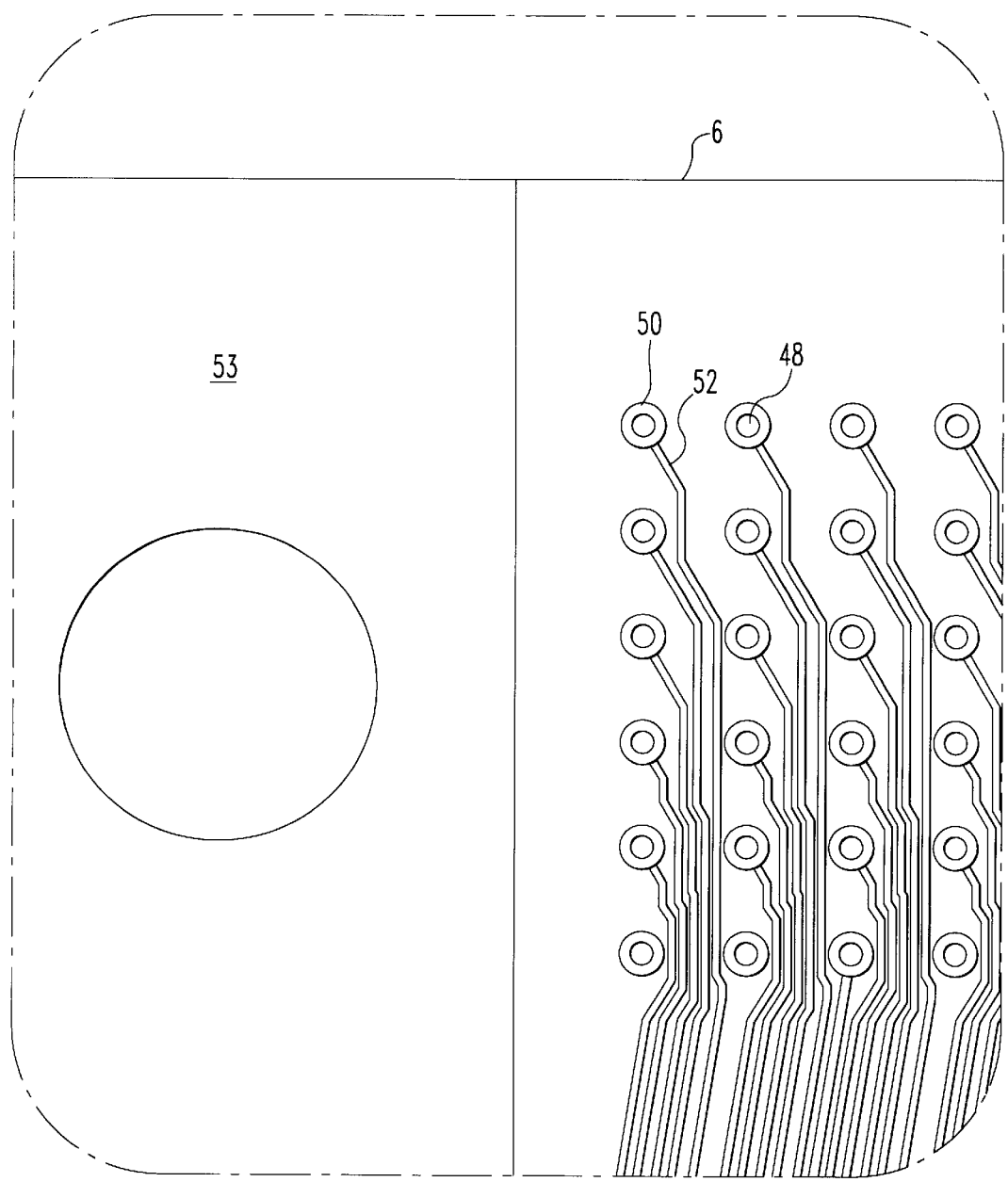
FIG. 3b is an enlarged view of a portion of FIG. 3a within line 3b.
Figure 3A:
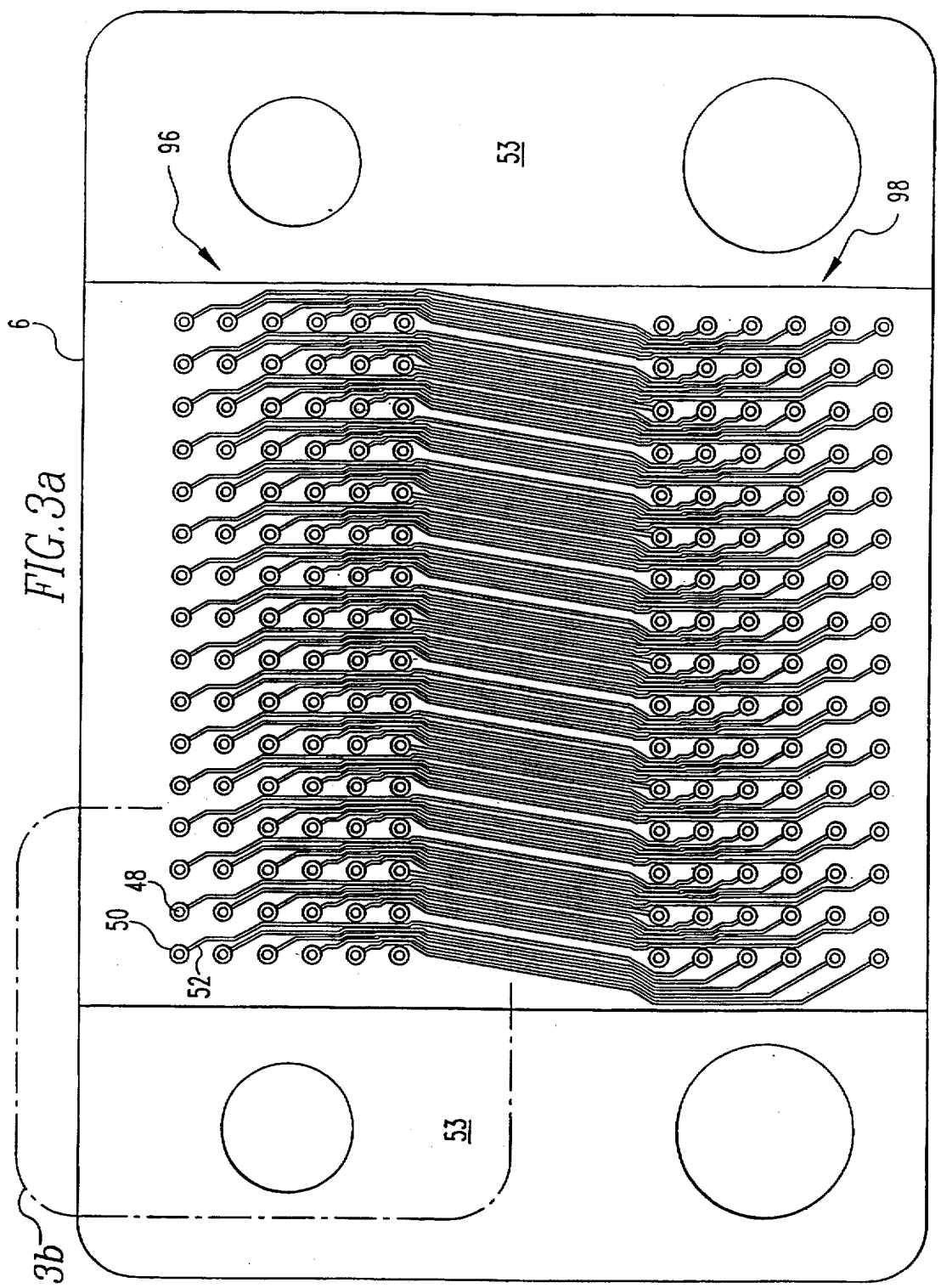
FIG. 3a is a plan view of a flexible substrate used in the compression connector of FIG. 1.
Figure 3B:
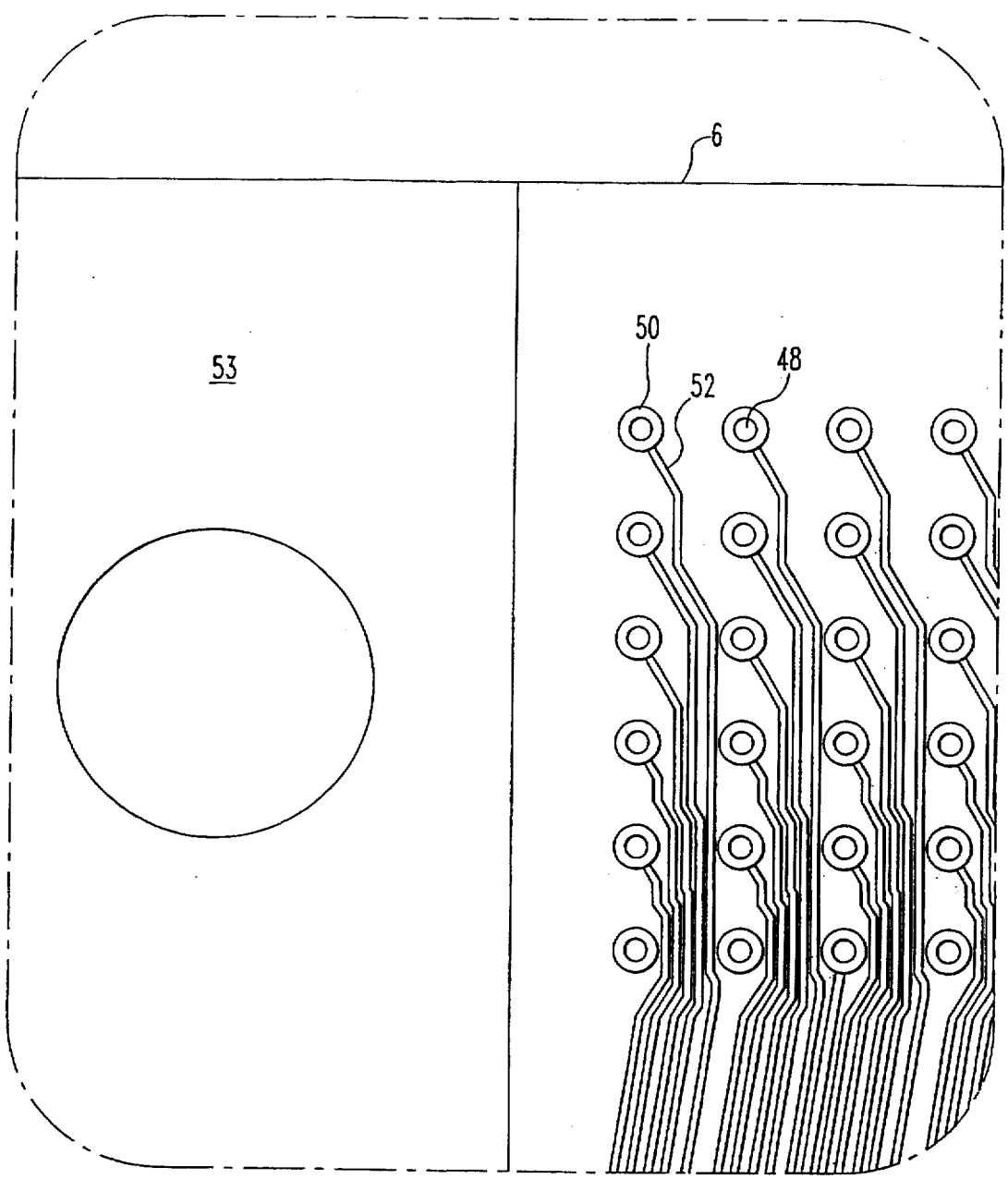
Figure 4A:
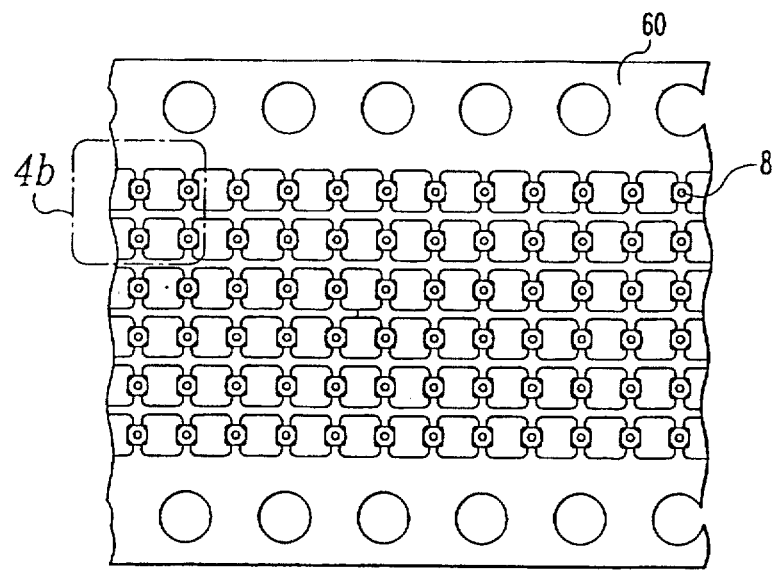
Figure 4B:
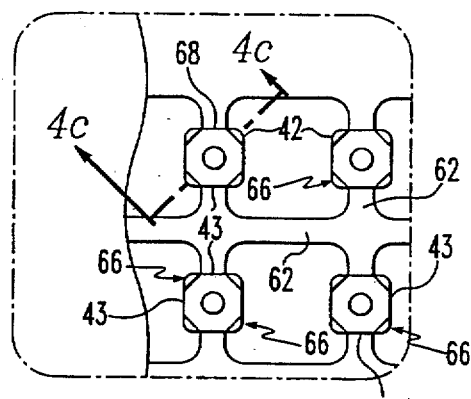
Figure 4C:
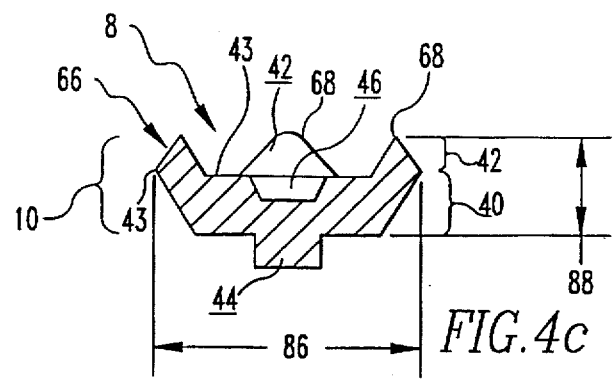
Figure 5:
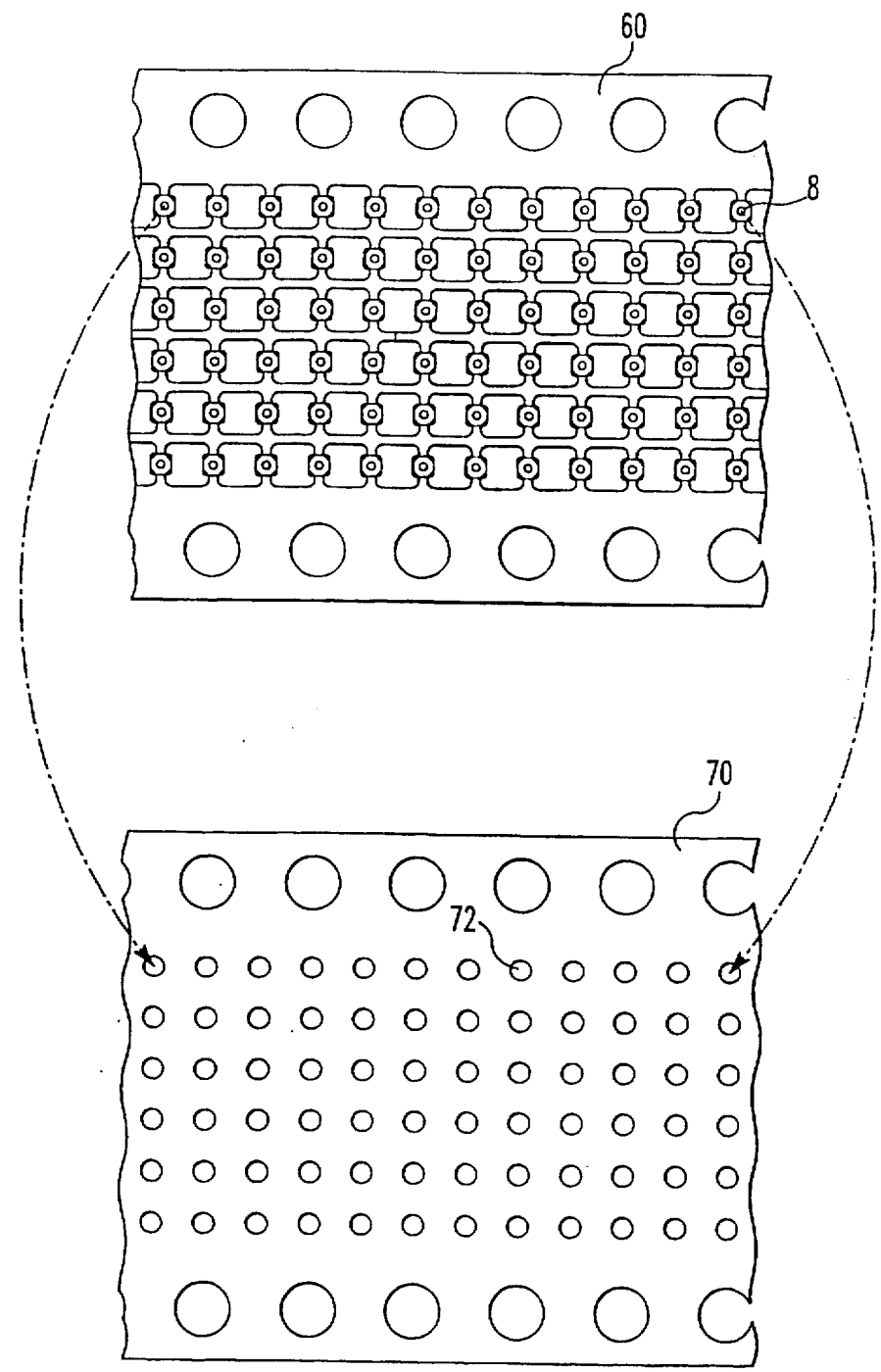
Figure 6:
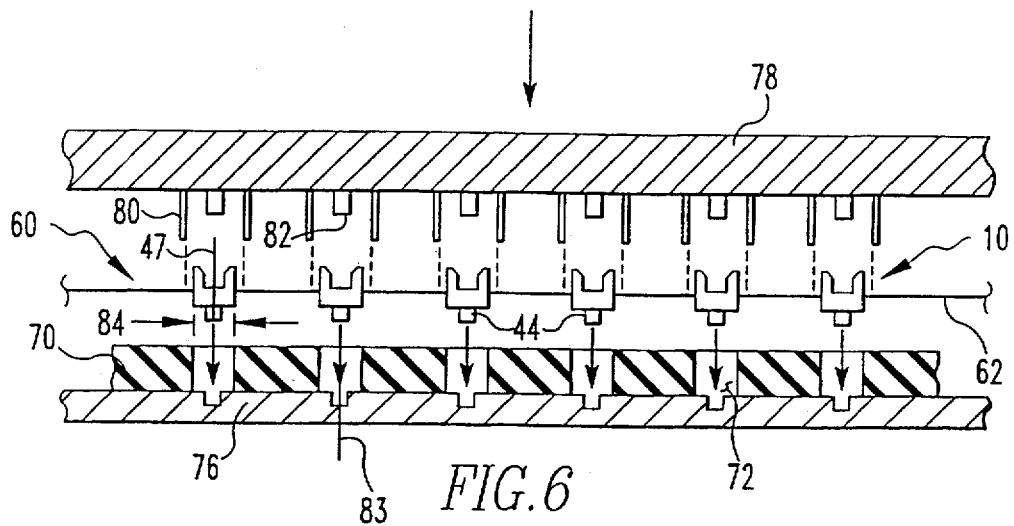
Figure 7:
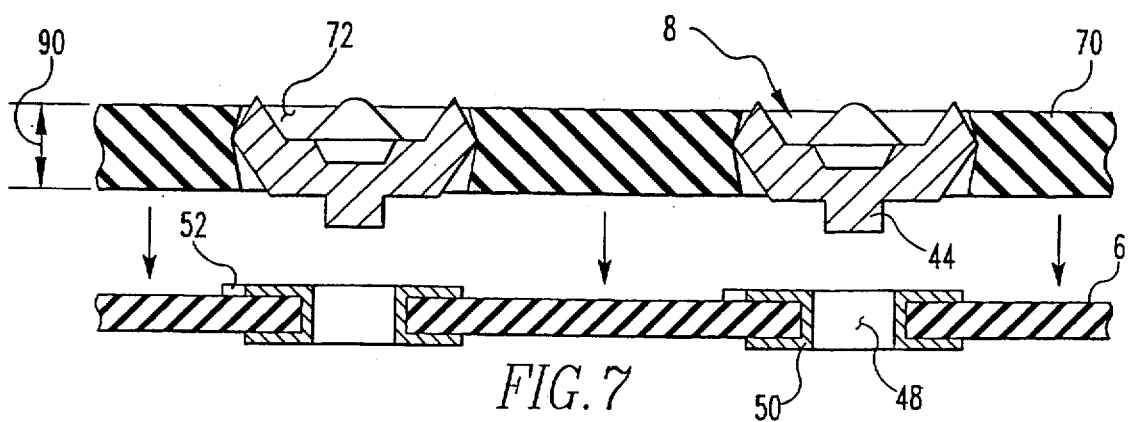

With reference to FIGS. 3a–3b and with ongoing reference to FIGS. 1a–1b, the flexible substrate 6 has a plurality of through-holes 48 formed therein that are adapted to receive the posts 44 of the contacts 8. The wall of each through-hole 48 includes metallization 50 formed therein to form a conductive through-hole. The metallization 50 in each through-hole 48 is preferably connected to a conductive line 52 or to one or more conductive ground planes 53 formed on the flexible substrate 6. The one or more conductive ground planes 53 are formed on one or both surfaces of the flexible substrate 6 to reduce or eliminate cross-talk between conductive lines 52 and/or to reduce or eliminate the effect on one or more of the conductive lines 52 of electromagnetic interference from external sources. The metallization 50 in each through-hole 48, the conductive lines 52 and the conductive ground planes 53 are formed on the flexible substrate 6 in a manner known in the art. To maintain the post 44 of each contact 8 received in a through-hole 48, the metallization 50 of each through-hole 48 and the posts 44 of the contacts 8 received therein are fused together, preferably utilizing a solder 54.

Figure 4A:
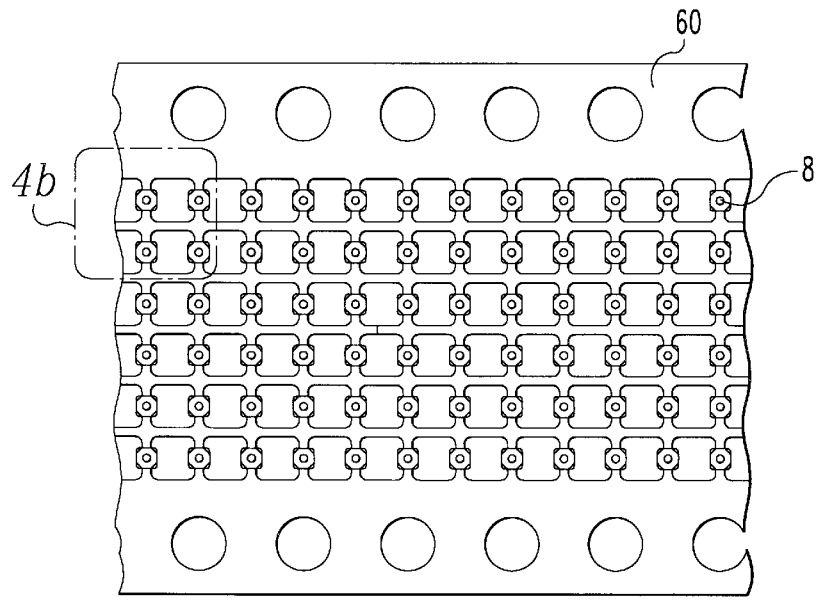
FIG. 4a is a plan view of a conductive strip that has been formed to include a plurality of contacts that are utilized in the compression connector of FIG. 1.
Figure 4B:
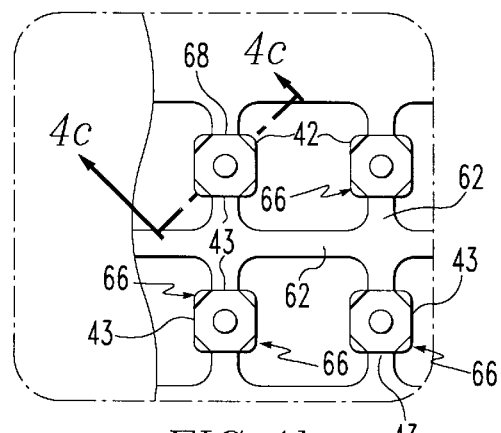
FIG. 4b is an enlarged view of a portion of the conductive strip of FIG. 4a within line 4b.
Figure 4C:
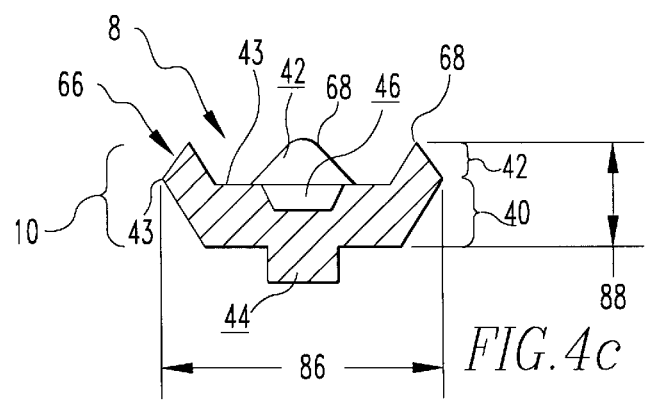
FIG. 4c is a cross section taken along lines 4c—4c in FIG. 4b.

With reference to FIGS. 4a–4c, an array of contacts 8 is formed by exposing a thin, flat strip 60 of conductive material to a stamping operation. The stamping operation also forms from the strip 60 a plurality of ribs 62 that extend between and secure together adjacent contacts 8.

In a preferred embodiment, the periphery 43 of the base 40 of each head 10 has a generally rectangular outline. Each corner 66 of the generally rectangular outline of the base 40 is rounded and includes one of the projections 42. Each projection 42 has a rounded edge 68 formed continuous with the periphery 43 of the base 40.

Figure 5:
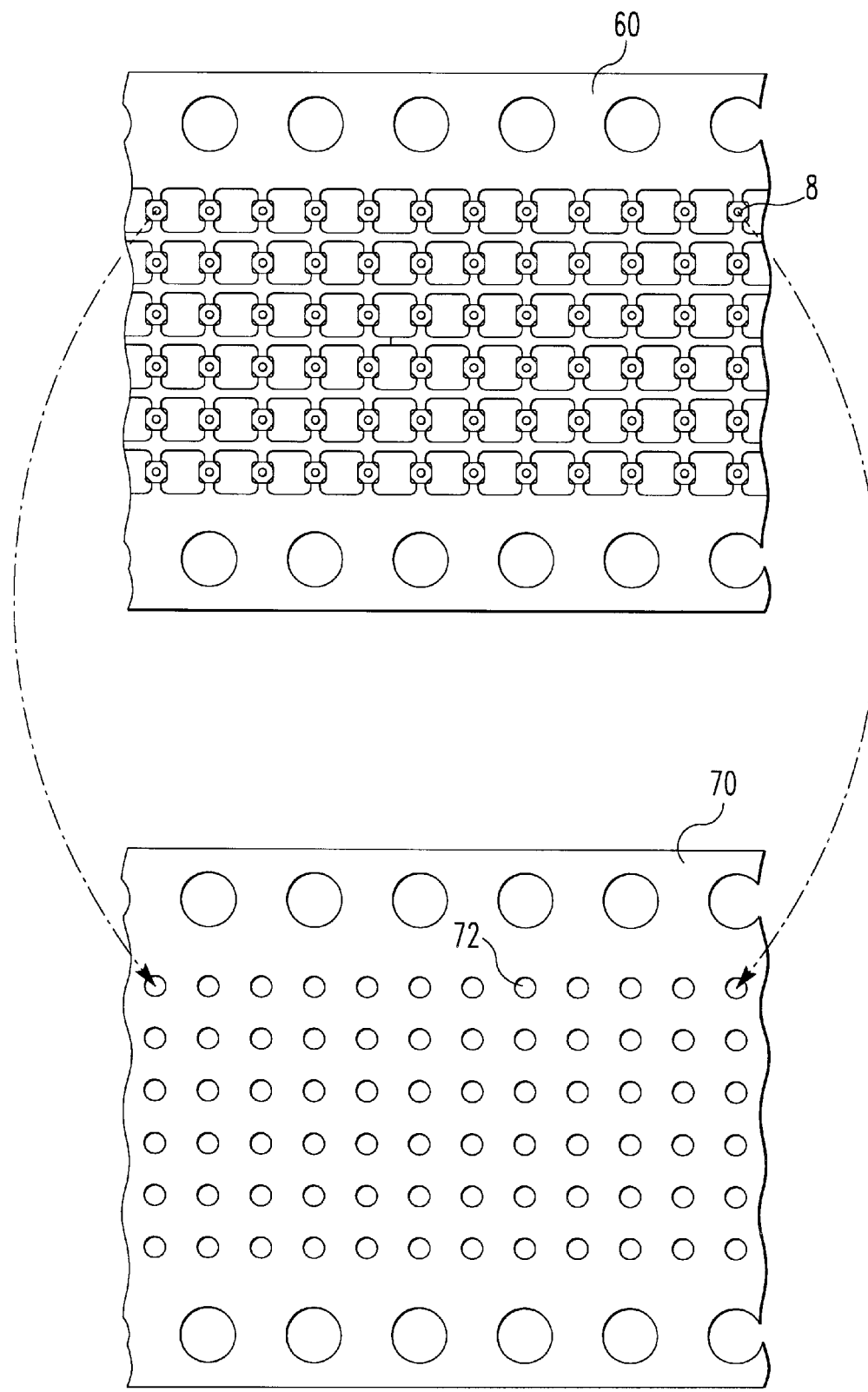
FIG. 5 is a plan view of the conductive strip of FIG. 4a aligned with a transfer film.

With reference to FIG. 5, to install the contacts 8 in the flexible substrate 6, the contacts 8 are first transferred to a flexible transfer film 70, such as Kapton®. More specifically, the strip 60 having the array of contacts 8 formed therein is aligned with the transfer film 70 so that each contact 8 is aligned in registration with one of a plurality of receiving apertures 72 in the transfer film 70.

Figure 6:
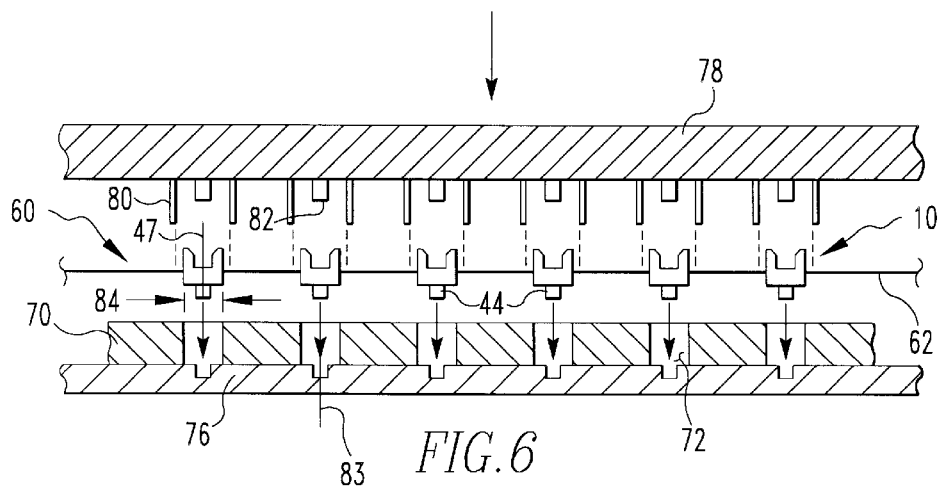
FIG. 6 is a cross section of the aligned conductive strip and transfer film of FIG. 5 positioned between a transfer base and an excising tool.

As shown in FIG. 6, the transfer film 70 is positioned between the strip 60 and a transfer base 76 so that the posts 44 of the contacts 8 are positioned in opposition with the transfer base 76 through the receiving apertures 72 of the transfer film 70. An excising tool 78 having a plurality of blades 80 and a plurality of push pins 82 is positioned on a side of the conductive strip 60 opposite the transfer film 70. In use, the excising tool 78 is moved towards the base 76 so that the blades 80 excise the contacts 8 from the ribs 62. The excised contacts 8 are then inserted into the receiving apertures 72 by the push pins 82 so that the lengthwise axes 47 of the posts 44 are substantially coaxial with lengthwise axes 83 of the receiving apertures 72.

Figure 7:
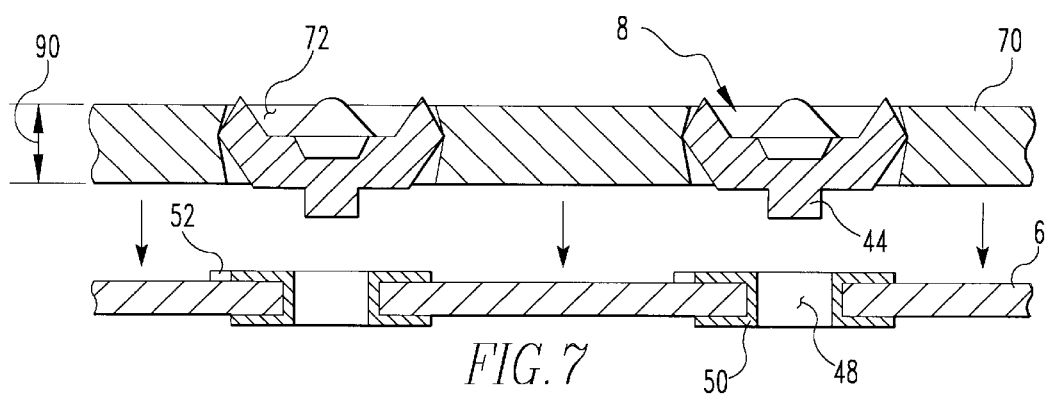

Before inserting the contacts 8, each receiving aperture 72 has a diameter 84 that is less than a diagonal distance 86 (shown in FIG. 4c) between opposite corners 66 of the base 40. As shown in FIG. 7, the receiving apertures 72 elastically deform to receive and secure the heads 10 of the contacts 8 therein. Preferably, each head 10 has a height 88 (shown in FIG. 4c) that is greater than a thickness 90 of the transfer film 70. Hence, when the heads 10 are inserted in the receiving apertures 72, the posts 44 of the contacts 8 are preferably positioned outside the receiving apertures 72. When the heads 10 are received in the receiving apertures 72, the transfer film 70 and the flexible substrate 6 are positioned so that the posts 44 are in registration with and receivable in the through-holes 48.

Figure 8:
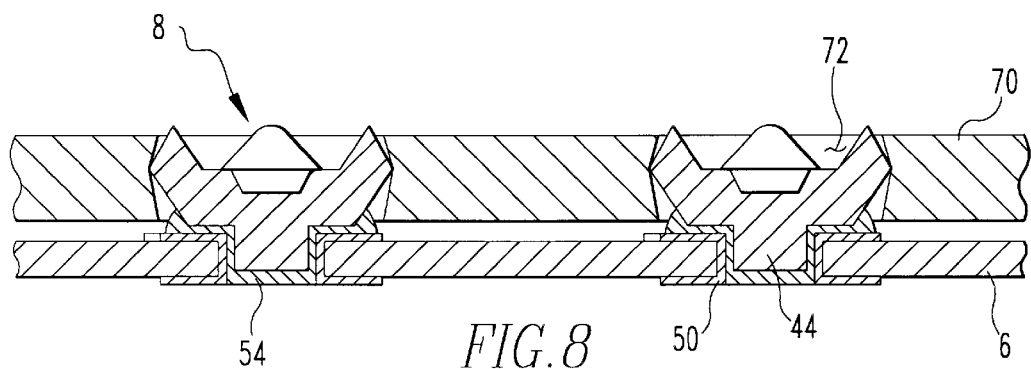
FIG. 8 is a cross section similar to FIG. 7 showing the transfer film and flexible substrate mated together with the posts of the contacts received within and soldered to the through-holes of the flexible substrate.

As shown in FIG. 8, the flexible substrate 6 and the transfer film 70 are brought together so that the posts 44 are received within the metallization 50 of the through-holes 48. The contacts 8 are secured to the flexible substrate 6 by fusing the posts 44 and the metallization 50 of the through-holes 48 together with the solder 54.

Figure 9:
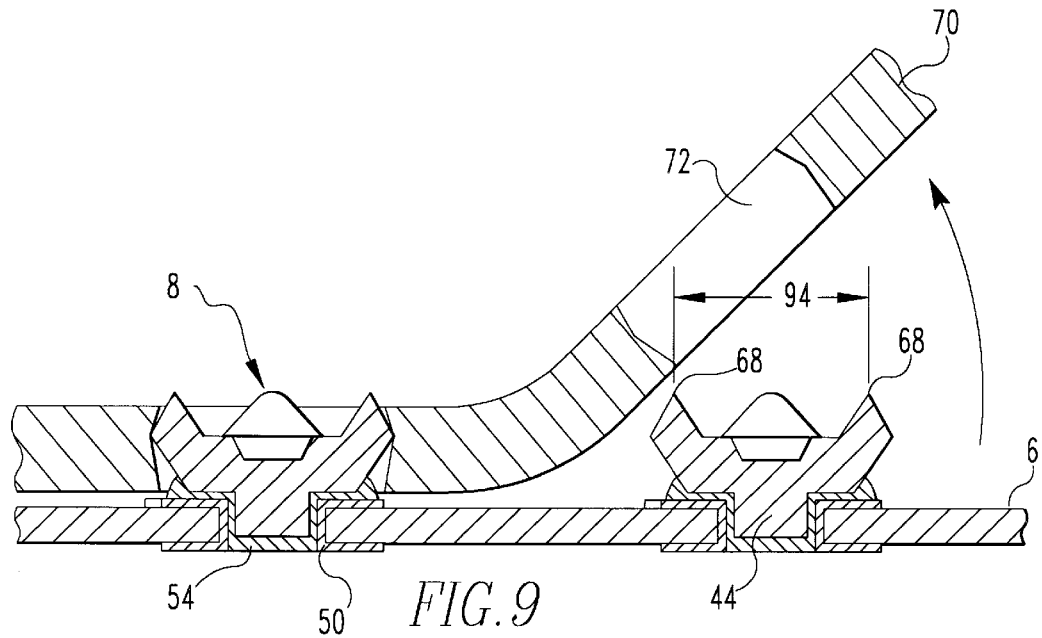
FIG. 9 is a cross section similar to FIGS. 7 and 8 and showing the separation of the transfer film from the flexible substrate and contacts.
Figure 1A:
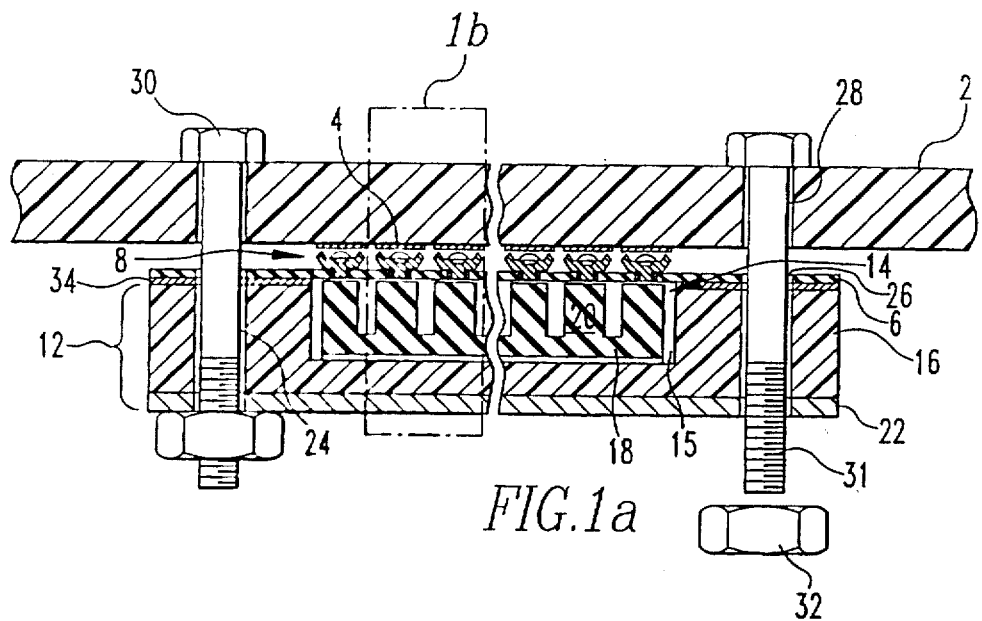
Figure 1B:
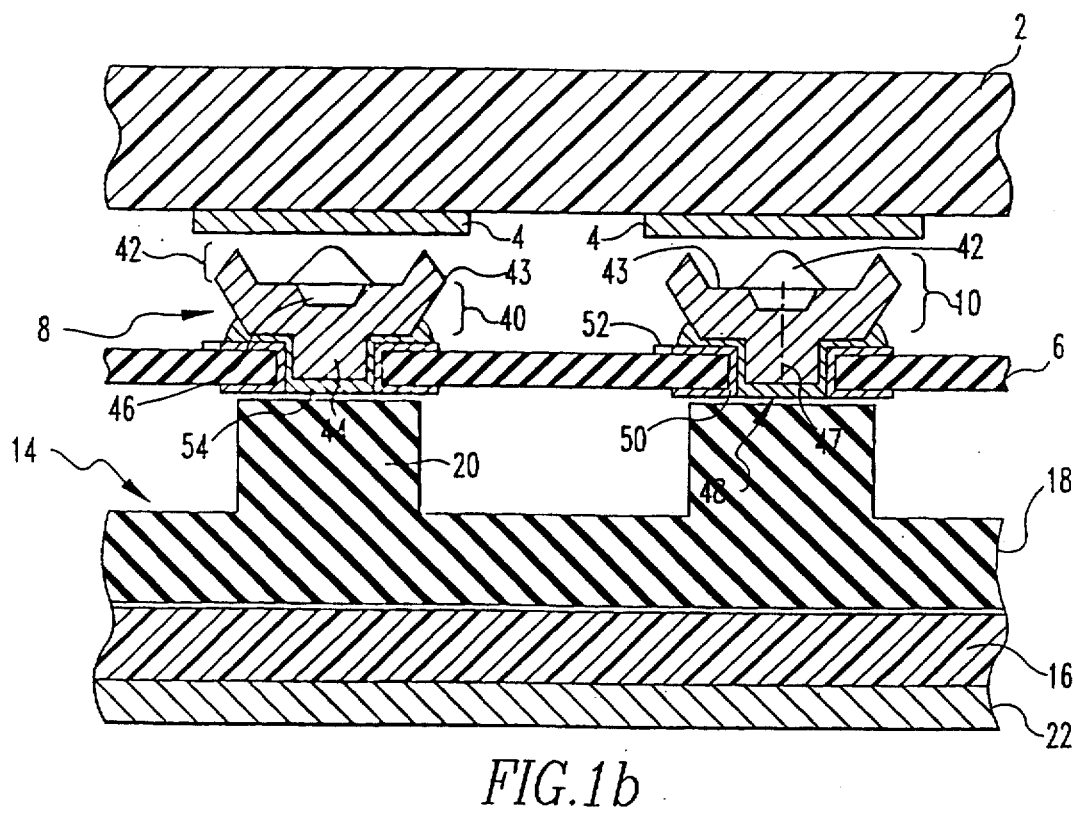
Figure 2A:
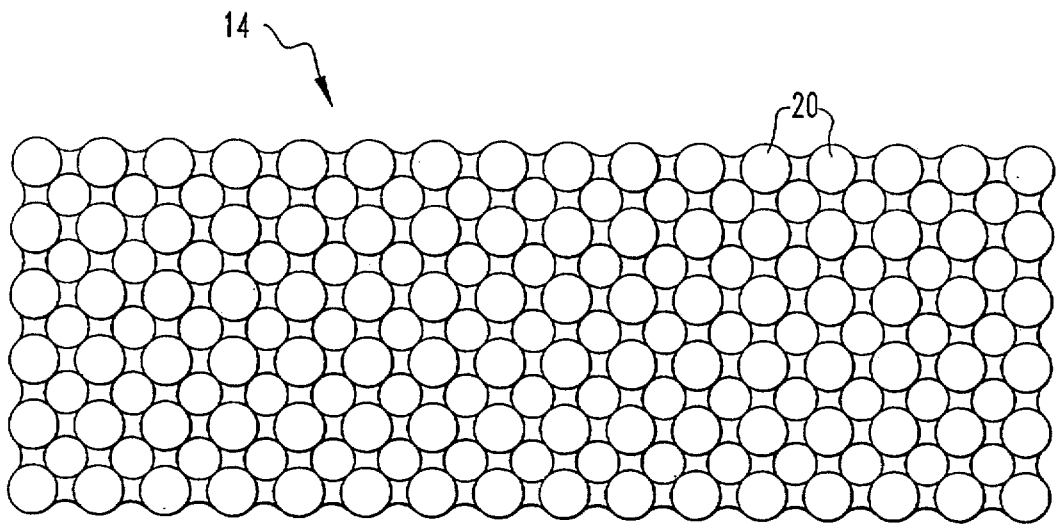
Figure 2B:
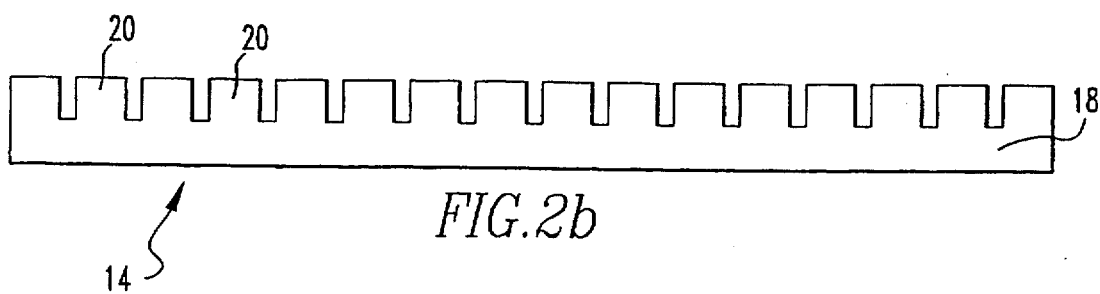

As shown in FIG. 9, the flexibility of the transfer film 70 and the elastic deformability of the receiving apertures 72 enables the transfer film 70 to be separated, e.g., peeled away, from the contacts 8 secured to the flexible substrate 6. When the transfer film 70 is separated, the flexible substrate 6 and contacts 8 can be utilized in the manner described above in connection with FIGS. 1a–1b.

As shown in FIG. 3a, a first plurality 96 of through-holes 48 and a second plurality 98 of through-holes 48 are preferably disposed on opposite sides of the flexible substrate 6. When the contacts 8 are fused into the first and second plurality 96, 98 of through-holes 48, the side of the flexible substrate 6 adjacent the first plurality 96 of through-holes 48 can be utilized to connect to one rigid substrate (not shown) and the side of the flexible substrate 6 adjacent the second plurality 98 of through-holes 48 can be utilized to connect to another rigid substrate (not shown) thereby effecting electrical connection between the rigid substrates.

In a preferred embodiment, each post 44 has a diameter between 7 and 8 mils and a length of 2 mils. The head 10 of each contact 8 has a height of 10 mils and the cavity 46 has a depth of 3 mils. The height of each projection 42 is 4 mils and a distance 94 (shown in FIG. 9) between rounded edges 68 of projections 42 on diagonally opposite corner 66 is 21.5 mils. The strip 60 and contacts 8 are formed from a strip of ¼ hard brass. The contacts 8 are plated with 5 micro-inches of soft gold over 30 micro-inches of palladium nickel over 50 micro-inches of sulfamate nickel. The conductors 52 and the ground planes 53 of the flexible substrate 6 are formed from ½ ounce copper which is deposited as a sheet on the flexible substrate 6 and then patterned and etched utilizing photolithographic and etching techniques known in the art.

Based on the foregoing, it can be seen that the contacts 8 are sufficiently small so that manual manipulation of contacts 8 into the through-holes 48 of the flexible substrate 6 is not practical. To this end, and in accordance with the present invention, forming the array of contacts 8 from the strip 60 enables the contacts 8 to be manipulated as an array. Similarly, the transfer film 70 enables the contacts 8 to be transferred as an array from the strip 60 to the flexible substrate 6. The transfer film 70 also helps maintain the posts 44 of the contacts 8 in the through-holes 48 during fusing of the posts 44 to the metallization 50 of the through-holes 48. Hence, the contacts 8 are manipulated as an array from the time they are formed from the strip 60 in the stamping operation until they are fused into the conductive through-holes in the flexible substrate 6. This manipulation of the contacts 8 as an array enables the compression connector of the present invention to be manufactured efficiently and cost effectively. Moreover, the compression connector of the present invention avoids the prior art teaching of plating contacts on the flexible substrate.

Because the metallization 50 in the through-holes 48 and the conductive lines 52 are pre-formed on the flexible substrate 6, it is preferable to avoid soldering the contacts 8 to the through-holes 48 prior to excising the contacts from the ribs 62 due to concerns over cutting with the blades 80 of the excising tool 78 the conductive lines 52 or the metallization 50 in the through-holes 48. Hence, the contacts 8 are first transferred to the flexible transfer film 70 which is utilized to transfer the contacts 8 to the flexible substrate 6 and which may thereafter be disposed as justified by the condition thereof.

The contacts 8 of the present invention are believed to provide over prior contacts improved contact with contact pads 4 on the rigid substrate 2. Specifically, the rounded edge 68 of each projection 42 contacting one of the contact pads 4 cuts through oils or films that may be present on the conductive pad 4 and/or the contact 8 prior to mating, thereby enabling conductive paths to be formed between each projection 42 in contact with the conductive pad 4.

As can be seen from the foregoing, the present invention provides a compression connector contact that promotes electrical contact with a conductive pad of a printed circuit board. The present invention also provides a method for making a flexible circuit connector that utilizes the provided compression connector contact and is less costly to manufacture than the prior art flexible circuit connectors.

The invention has been described with reference to the preferred embodiment. Obvious modifications and alterations will occur to others upon reading and understanding the preceding specification. It is intended that the invention be construed as including all such modifications and alterations insofar as they come within the scope of the appended claims or the equivalents thereof.

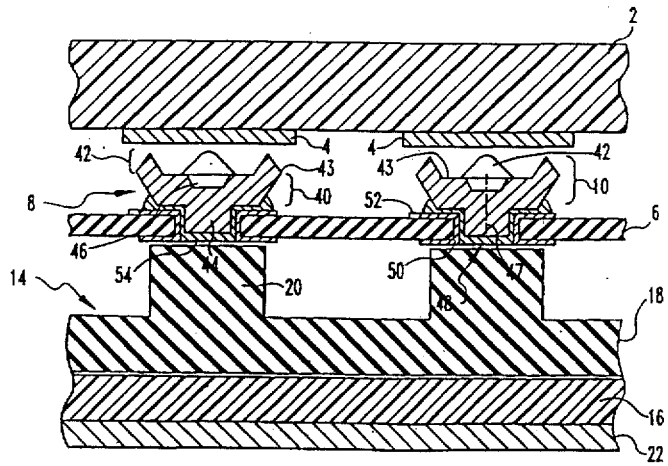

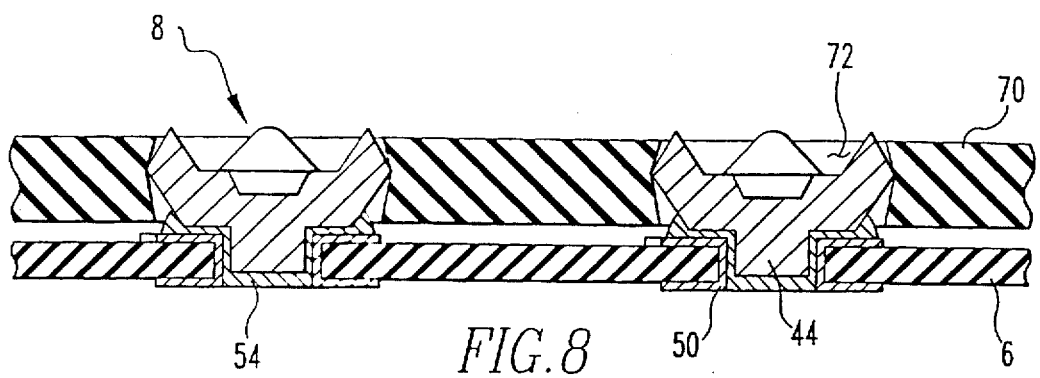
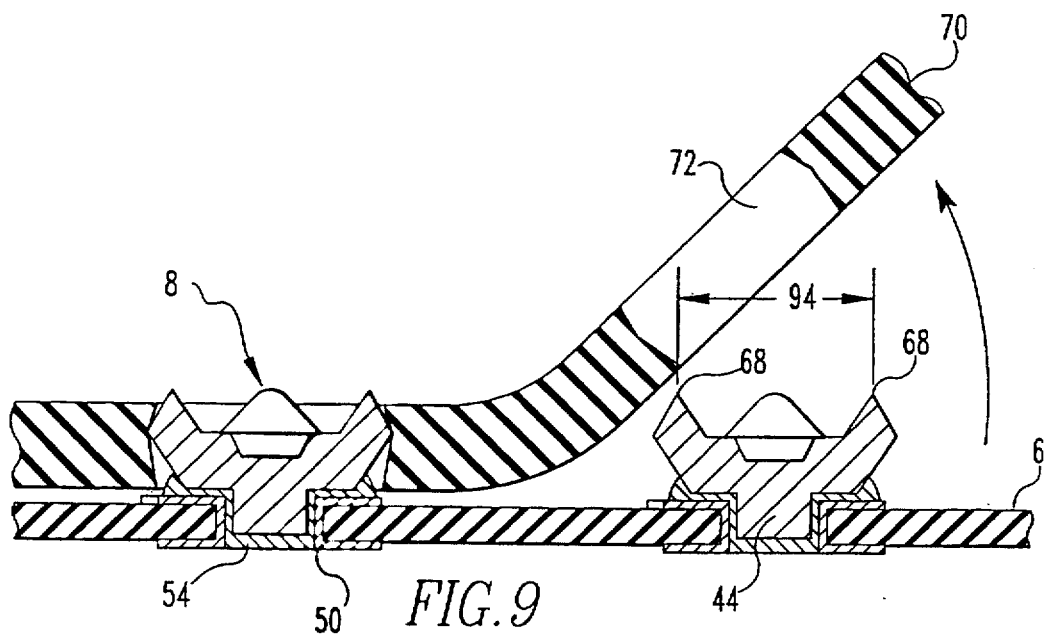

We claim:

1. A compression connector utilized to electrically connect together conductive pads disposed on one or more substrates, the connector comprising:

a flexible insulating substrate having a plurality of conductive through-holes therein and at least one conductive line thereon extending between at least two of the conductive through-holes; and a plurality of contacts formed in a stamping operation, each contact having a post connected to a base of a crown-shaped head having a plurality of projections around the periphery of the base that extend away from the base in a direction opposite the post, the post of each contact secured in one of the plurality of conductive through-holes.

2. The compression connector as set forth in claim 1, further including:

a compression mat having a plurality of resilient columns extending away from a resilient base, each resilient column having a distal end alignable in registration with a distal end of a post of one of the plurality of contacts, each distal end of each resilient column in contact with at least one of (i) the distal end of the post in registration therewith and (ii) a solder used to secure the post in registration therewith in the one of the plurality of conductive through-holes, when the flexible insulating substrate and the compression mat are in compression.

3. The compression connector as set forth in claim 1, further including:

a transfer film having a plurality of elastically deformable receiving apertures which receive the crown-shaped heads of the plurality of contacts, each receiving aperture securing the crown-shaped head of the contact received therein so that the post thereof is positioned outside the receiving aperture.

4. The compression connector as set forth in claim 1, further including:

a rigid substrate having a plurality of conductive pads on a surface thereof and at least one conductive line connected to at least one of the conductive pads, wherein aligning the rigid substrate and the flexible substrate aligns at least one projection of one of the contacts secured to the flexible substrate in registration with one of the conductive pads on the surface of the rigid substrate.

5. The compression connector as set forth in claim 4, further including:

a compression fitting which forces together the at least one projection of the one of the contacts and the conductive pad in registration therewith.

6. The compression connector as set forth in claim 5, further including:

a plurality of alignment holes in each of the flexible substrate, the rigid substrate and the compression fitting; and a plurality of alignment pins, each alignment pin receivable through one of the plurality of alignment holes in each of the flexible substrate, the rigid substrate and the compression fitting, wherein:

the alignment holes and the alignment pins co-act to align the flexible substrate, the rigid substrate and the compression fitting so that the heads of the plurality of contacts are aligned in registration with the plurality of contact pads.

7. The compression connector as set forth in claim 6, wherein:

the alignment pins are bolts, each bolt having a threaded end with external threads adapted to mate with internal threads of a threaded nut; and applying the nuts to the bolts urges the compression fitting and the rigid substrate together so that the at least one projection of the one of the contacts and the conductive pad in registration therewith are forced together.

8. A compression connector contact formed from a strip of conductive material in a stamping operation, the compression connector contact comprising:

a crown-shaped head having a base and a plurality of projections disposed around the periphery of the base and extending to one side thereof; and a post extending from the side of the base opposite the projections.

9. The compression connector as set forth in claim 8, further including on the side of the base opposite the post a cavity in registration with a lengthwise axis of the post.

10. The compression connector as set forth in claim 8, wherein:

the base has a periphery having a generally rectangular outline; and each corner of the generally rectangular outline of the base is rounded.

11. The compression connector as set forth in claim 10, wherein:

each corner of the outline of the base includes one of the plurality of projections; and each projection has a rounded edge formed continuous with the periphery of the base.

12. A compression connector comprising:

a flexible substrate having a conductive line formed thereon;

a contact formed from a strip of conductive material in a stamping operation apart from the flexible substrate and connectable to the flexible substrate in electrical contact with the conductive line thereon; and a rigid substrate having a conductive line thereon, the rigid substrate and the flexible substrate positionable so that the contact electrically connects the conductive line on the flexible substrate with the conductive line on the rigid substrate.

13. The compression connector as set forth in claim 12, wherein:

the rigid substrate includes thereon a conductive pad in electrical contact with the conductive line on the rigid substrate; and the rigid substrate and the flexible substrate are positionable so that the contact connected to the flexible substrate contacts the conductive pad on the rigid substrate.

14. The compression connector as set forth in claim 12, wherein the contact is formed by stamping a thin and flat strip of conductive material.

15. The compression connector as set forth in claim 12, wherein the contact has a crown-shaped head which includes a plurality of projections disposed around a periphery of the head and extending to one side of the head.

16. The compression connector as set forth in claim 15, wherein:

the contact has a post extending from the head in a direction opposite the plurality of projections; and the post is receivable in a through-hole formed in the flexible substrate.

17. The compression connector as set forth in claim 15, wherein:

the head includes a base having a generally rectangular outline; and one of the plurality of projections is disposed at each corner of the generally rectangular outline of the base.

* * * * *

UNITED STATES PATENT AND TRADEMARK OFFICE
CERTIFICATE OF CORRECTION

PATENT NO. : 5,899,757
DATED : May 4, 1999
INVENTOR(S) : Douglas A. Neidich et al.

It is certified that error appears in the above-identified patent and that said Letters Patent is hereby corrected as shown below:

In the Drawings, substitute attached drawings for the printed drawings

The Title page, showing the illustrative figure should be deleted to be replaced with the attached title page.

Signed and Sealed this

Twenty-eighth Day of December, 1999

Attest:

Q. TODD DICKINSON

Attesting Officer

Acting Commissioner of Patents and Trademarks

United States Patent [19]

Neidich et al.

[11] Patent Number: 5,899,757
[45] Date of Patent: May 4, 1999

[54] COMPRESSION CONNECTOR

[75] Inventors: Douglas A. Neidich, Lower Paxton Township, Dauphin County; Grant R. Adams, Jr., East Pennsboro Township, Cumberland County, both of Pa.

[73] Assignee: InterCon Systems, Inc., Middletown, Pa.

[21] Appl. No.: 08/963,401

[22] Filed: Nov. 3, 1997

[51] Int. Cl.⁶ .................................................. H01R 9/09
[52] U.S. Cl. .................................................. 439/67
[58] Field of Search .................................. 439/67, 74

[56] References Cited

U.S. PATENT DOCUMENTS

| | | | |
|---|---|---|---|
| 3,880,486 | 4/1975 | Avakian | 439/86 |
| 3,924,915 | 12/1975 | Conrad | 439/66 |
| 4,442,938 | 4/1984 | Murphy | 206/728 |
| 4,451,714 | 5/1984 | Eventoff | 200/5 A |
| 4,466,184 | 8/1984 | Cuneo et al. | 29/830 |
| 4,602,317 | 7/1986 | Rovnyak et al. | 361/785 |
| 4,695,258 | 9/1987 | Hanson et al. | 439/67 |
| 4,707,657 | 11/1987 | Bøegh-Petersen | 324/537 |
| 4,902,234 | 2/1990 | Brodsky et al. | 439/67 |
| 4,975,068 | 12/1990 | Squires | 439/67 |
| 4,976,626 | 12/1990 | Dibble et al. | 439/67 |
| 5,049,084 | 9/1991 | Bakke | 439/66 |
| 5,059,129 | 10/1991 | Brodsky et al. | 439/67 |
| 5,105,537 | 4/1992 | Datta et al. | 29/884 |
| 5,118,299 | 6/1992 | Burns et al. | 439/74 |
| 5,163,834 | 11/1992 | Chapin et al. | 439/66 |
| 5,171,154 | 12/1992 | Casciotti et al. | 439/67 |
| 5,190,463 | 3/1993 | Datta et al. | 439/74 |
| 5,215,471 | 6/1993 | Reymond et al. | 439/66 |
| 5,248,261 | 9/1993 | Conroy-Wass et al. | 439/65 |
| 5,248,262 | 9/1993 | Busacco et al. | 439/66 |
| 5,354,205 | 10/1994 | Feigenbaum et al. | 439/67 |
| 5,461,482 | 10/1995 | Wilson et al. | 347/50 |
| 5,501,610 | 3/1996 | Ikemoto | 439/498 |
| 5,514,008 | 5/1996 | Kocher et al. | 439/495 |
| 5,533,904 | 7/1996 | Nobel et al. | 439/67 |
| 5,575,662 | 11/1996 | Yamamoto et al. | 439/67 |

OTHER PUBLICATIONS

"A High Density Pad-on-Pad Connector Utilizing a Flexible Circuit", R.S. Pokrzywa et al., Copyright 1993 IEEE, pp. 461–464.

"A High Density Edge Connector", J. Campbell et al., Copyright 1995, IEEE, pp. 140–143.

Primary Examiner—Neil Abrams
Assistant Examiner—T C Patel
Attorney, Agent, or Firm—Webb Ziesenheim Logsdon Orkin & Hanson, P.C.

[57] ABSTRACT

A connector utilized to electrically connect together conductive pads disposed on different substrates includes a flexible substrate having a plurality of conductive through-holes therein. A conductive line formed in the flexible substrate extends between at least two of the conductive through-holes. A plurality of contacts are mounted in the conductive through-holes of the flexible substrate. Each contact includes a post connected to a base of a crown-shaped head having a plurality of projections around the periphery of the base that extend away from the base in the direction opposite the post. The post of each contact is soldered into one of the plurality of conductive through-holes. A compression mat positioned on a side of the flexible substrate opposite the crown-shaped heads includes a plurality of resilient cylinders that extend away from a resilient base. Each resilient cylinder has a distal end alignable in registration with a distal end of the post of one of the plurality of contacts. A compression fitting is positionable adjacent the resilient base of the compression mat. The compression fitting co-acts with one of the substrates to apply a clamping force therebetween that urges a projection of each contact into electrical contact with one of the conductive pads.

17 Claims, 8 Drawing Sheets